(12) United States Patent
Varsamis et al.

(10) Patent No.: US 7,116,182 B2
(45) Date of Patent: Oct. 3, 2006

(54) METHOD AND SYSTEM FOR DOWNHOLE CLOCK HAVING COMPENSATION

(75) Inventors: Georgios L. Varsamis, Houston, TX (US); Gary D. Althoff, Houston, TX (US); Laurence T. Wisniewski, Houston, TX (US); Denis P. Schmitt, Katy, TX (US); Abbas Arian, Houston, TX (US); James H. Dudley, Spring, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 0 days.

(21) Appl. No.: 10/453,411

(22) Filed: Jun. 3, 2003

(65) Prior Publication Data
US 2004/0246059 A1     Dec. 9, 2004

(51) Int. Cl.
*H03B 5/32* (2006.01)
*H03B 5/04* (2006.01)
*G01V 1/40* (2006.01)

(52) U.S. Cl. .............. 331/176; 331/158; 331/66; 331/69; 331/70; 331/44; 367/86; 367/38; 367/25

(58) Field of Classification Search ............. 331/176, 331/158, 66, 69, 70, 40; 367/86, 25, 38
See application file for complete search history.

(56) References Cited

U.S. PATENT DOCUMENTS

| | | | | |
|---|---|---|---|---|
| 4,079,280 A | * | 3/1978 | Kusters et al. | 310/318 |
| 4,443,116 A | * | 4/1984 | Yoshida et al. | 368/202 |
| 5,113,379 A | * | 5/1992 | Scherbatskoy | 367/83 |
| 5,659,270 A | * | 8/1997 | Millen et al. | 331/69 |
| 5,659,884 A | * | 8/1997 | Daughtry et al. | 455/75 |
| 5,917,272 A | * | 6/1999 | Clark et al. | 310/343 |
| 6,253,330 B1 | * | 6/2001 | Denkin et al. | 713/300 |
| 6,337,603 B1 | * | 1/2002 | Kinugasa et al. | 331/66 |
| 6,606,009 B1 | * | 8/2003 | Gunawardana et al. | 331/176 |
| 2002/0060952 A1 | * | 5/2002 | Cecconi et al. | 367/25 |
| 2002/0079976 A1 | * | 6/2002 | Ho et al. | 331/18 |
| 2002/0125966 A1 | | 9/2002 | Gunawardana et al. | |

OTHER PUBLICATIONS

John R. Vig. "Quartz Crystal Resonators and Oscillators For Frequency Control and Timing Applications, a Tutorial," Chapters 2, 6 and 8; Jan. 2001.

* cited by examiner

*Primary Examiner*—Joseph Chang
(74) *Attorney, Agent, or Firm*—Mark E. Scott; Conley Rose, P.C.

(57) ABSTRACT

A downhole crystal-based clock that is substantially insensitive to the factors that cause frequency deviation. The clock may be maintained at a predetermined temperature using a temperature sensing device and a heating device, where the predetermined temperature corresponds to the temperature at which the crystal experiences only slight frequency deviation as a function of temperature. A microprocessor may monitor the clock and compensate for long-term aging effects of the crystal according to a predetermined algorithm. The predetermined algorithm may represent long-term aging effects of the crystal which were derived by comparing the crystal clock to a more accurate clock (e.g., an atomic clock) prior to placing the clock downhole. In this manner, the crystal-based clock may be substantially free from the factors that cause frequency, and therefore time variations.

27 Claims, 4 Drawing Sheets

METHOD AND SYSTEM FOR DOWNHOLE CLOCK HAVING COMPENSATION

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

1. Field of the Invention

The preferred embodiments relate to well logging. More particularly, the preferred embodiments relate to generating a downhole clock for improving data measurements taken during logging.

2. Description of the Related Art

Modern petroleum drilling and production operations demand a great quantity of information relating to parameters and conditions downhole. Such information may include characteristics of the earth formations traversed by the wellbore, along with data relating to the size and configuration of the borehole itself. The collection of information relating to conditions downhole, which commonly is referred to as "logging," may be performed by several methods.

In conventional wireline logging, a probe or "sonde," housing formation sensors, may be lowered into the borehole after some or all of the well has been drilled. Once in the borehole, the sonde may be used to determine characteristics of the borehole, and the characteristics of formations traversed by the borehole. The upper end of the sonde may be attached to a wireline that suspends the sonde in the borehole. Power may be transmitted to the sensors and instrumentation in the sonde through the wireline. Similarly, the instrumentation in the sonde may communicate information to the surface by electrical signals transmitted through the wireline.

An alternative method of logging involves the collection of data during the drilling process. Collecting and processing data during the drilling process eliminates the necessity of removing or tripping the drilling assembly to insert a wireline logging tool. Accordingly, drilling techniques may be modified during drilling in order to optimize performance while minimizing down time. Designs for measuring conditions downhole including the movement and location of the drilling assembly contemporaneously with the drilling of the well have come to be known as "measurement-while-drilling" techniques, or "MWD." Similar techniques, concentrating more on the measurement of formation parameters, commonly have been referred to as "logging-while-drilling" techniques, or "LWD." For the purposes of this disclosure, the term LWD will be used with the understanding that this term encompasses both the collection of formation parameters and the collection of information relating to the movement and position of the drilling assembly.

Sensors or transducers may be located at the lower end of the drillstring in LWD systems. During drilling, these sensors may continuously or intermittently monitor drilling parameters and formation characteristics. In some circumstances, energy sources for measurements, such as acoustic energy sources, may be located proximate to sensors on the drillstring. In other circumstances, the energy sources may be located elsewhere, such as seismic sources at the surface or within other boreholes. In order to retrieve useful information from received signals, it may be necessary to measure the elapsed time between when the signal emanates from the source, and reception by the downhole sensor. Thus, each datum received may be associated with an instant of time—i.e., time-stamped—based on a downhole clock in LWD operations. If the source energy originated from downhole, the transmission time and arrival time may be correlated by the same clock; however, if the energy originates from the surface (or other location), a second clock may also be used, which presents difficulty in synchronizing the two clocks to determine propagation time of the interrogating signals.

BRIEF SUMMARY OF SOME OF THE PREFERRED EMBODIMENTS

Accordingly, there is disclosed herein a method and apparatus for a downhole clock that is substantially insensitive to the factors that may cause frequency (and therefore time) deviation. In some embodiments, the downhole clock may include an oscillator and a temperature regulator. The oscillator may, in combination with other devices, provide a downhole clock for time-stamping downhole measurements, and the oscillator may include a crystal. The temperature regulator may maintain the oscillator within a predetermined temperature range so that the crystal's frequency deviations caused by temperature fluctuations are small. Also, the downhole clock's time may be compensated for the crystal's frequency deviation, possibly caused by aging.

BRIEF DESCRIPTION OF THE DRAWINGS

A better understanding of the present invention can be obtained when the following detailed description of the preferred embodiment is considered in conjunction with the following drawings, in which.

Figure 1:
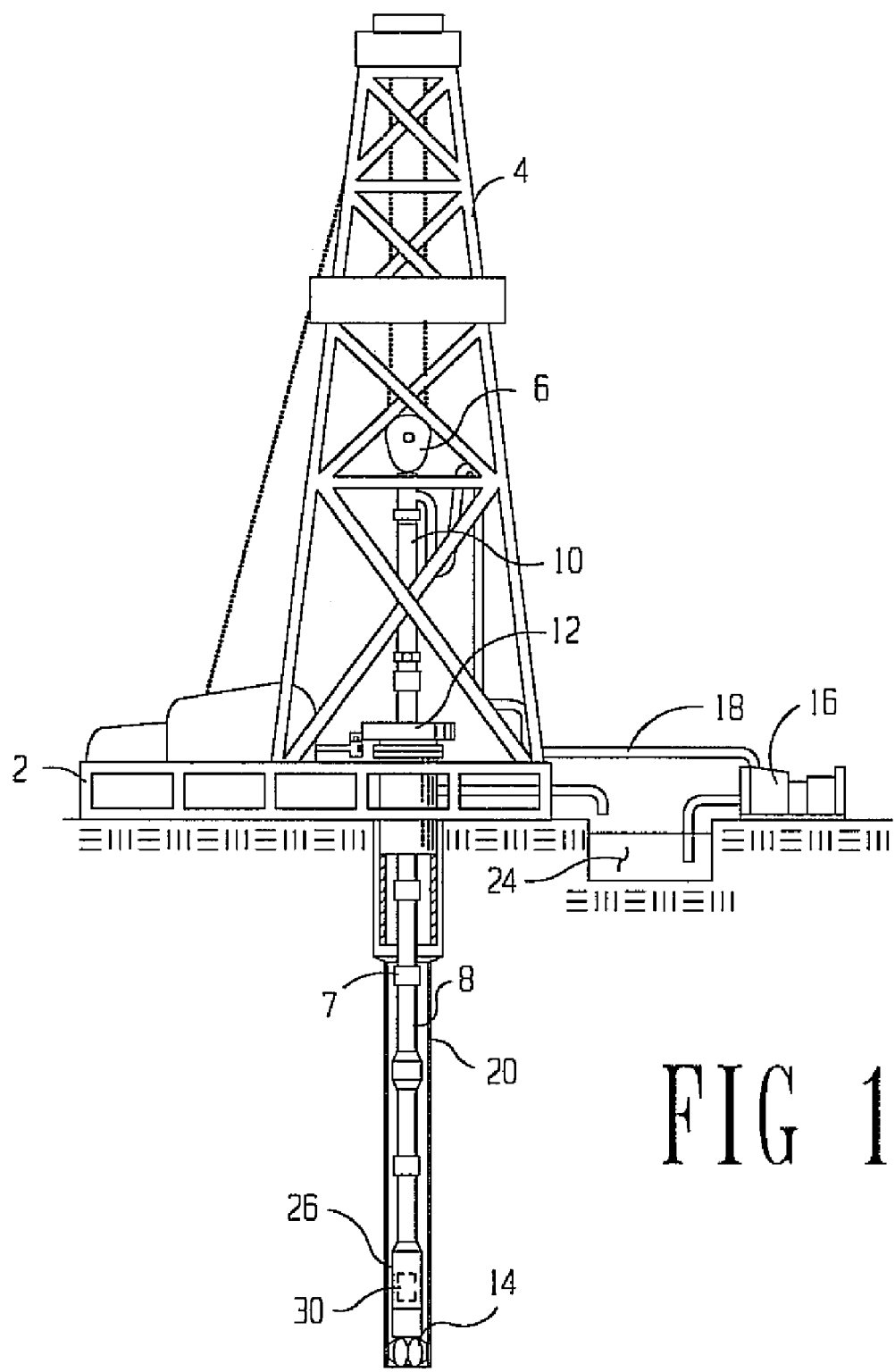
FIG. 1 illustrates a well during drilling operations.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

NOTATION AND NOMENCLATURE

Certain terms are used throughout the following description and claims to refer to particular system components. This document does not intend to distinguish between components that differ in name but not function.

In the following discussion and in the claims, the terms "including" and "comprising" are used in an open-ended fashion, and thus should be interpreted to mean "including, but not limited to . . . ". Also, the term "couple" or "couples" is intended to mean either an indirect or direct electrical or mechanical connection. Thus, if a first device couples to a second device, that connection may be through a direct connection, or through an indirect connection via other devices and connections.

DETAILED DESCRIPTION OF THE PREFERRED EMBODIMENTS

FIG. 1 illustrates a well during drilling operation. A drilling platform 2 may be equipped with a derrick 4 that supports a hoist 6. Drilling of oil and gas wells may be carried out by a string of drill pipes connected together by "tool" joints 7 so as to form a drillstring 8. The hoist 6 suspends a kelly 10 that may be used to lower the drillstring 8 through rotary table 12. A drill bit 14 may be connected to the lower end of the drillstring 8. Bit 14 may be rotated and drilling accomplished by rotating the drillstring 8, the bit 14 may be rotated by use of a downhole motor near the drill bit, or both methods may be used. Drilling fluid, termed "mud," may be pumped by mud recirculation equipment 16 through supply pipe 18, through drilling kelly 10, and down through the drillstring 8 at high pressures and volumes to emerge through nozzles or jets in the drill bit 14. The mud may then travel back up via an annulus formed between the exterior of the drillstring 8 and the borehole wall 20, through a blowout preventer (not specifically shown), and into a mud pit 24 on the surface. A downhole tool 26 comprising a tool body may also be coupled within the drillstring 8, where the downhole tool 26 may be used for LWD.

LWD often involves the measurement of various downhole properties. Sensors or receivers (not specifically shown) may be integrated into the tool body of downhole tool 26 such that data may be measured as the drillstring 8 progresses through the formation. Downhole tool 26 may also include a downhole clock 30 that may contain a crystal-based reference with controlled accuracy. Using a time value generated by downhole clock 30, data received may be time-stamped to indicate the time at which formation interrogation energy was received. The arrival time information of the formation interrogating energy may thus be used to determine formation properties. In a specific, but non-limiting example, seismic energy may be imparted to ground at or near the surface, or possibly in other wellbores proximate to the well being drilled. The total propagation time, as calculated by the difference between the time seismic energy was imparted and the arrival time of the seismic energy may thus be determined, in part, by the time values produced by the downhole clock 30.

Downhole clock 30 may include a quartz crystal and accompanying circuitry. The accompanying circuitry may derive a time value based on a frequency of oscillation of the crystal. However, the actual frequency output of a crystal oscillator may vary with operating conditions such as time, temperature, vibrations, and the like, and thus may cause "uncertainty." The uncertainty of a time base reference refers to range of possible frequencies within which the oscillation frequency may fall. For example, if a crystal is expected to oscillate at 10 MHz, and the uncertainty is ±0.01 MHz, then the actual frequency may be between 9.99 MHz and 10.01 MHz.

Time base uncertainties may also be expressed in fractional parts, for example, a crystal may have an uncertainty of 2 parts per million (ppm) or $2 \times 10^{-6}$. Thus, if an oscillator has an expected frequency of 10 MHz with an uncertainty of $2 \times 10^{-6}$, then the actual frequency may be in the range of 9,999,980 Hz to 10,000,020 Hz. Because a crystal's frequency of oscillation may vary depending on operating conditions (temperature, vibration, time, etc.), uncertainty is usually referred to with respect to a particular condition. For example, a 10 MHz crystal may have an uncertainty of 5 ppm/1° C., such that if the crystal experienced a 500 change in temperature then the actual operating frequency of the crystal may be 10 MHz±2.5 kHz.

Figure 2:
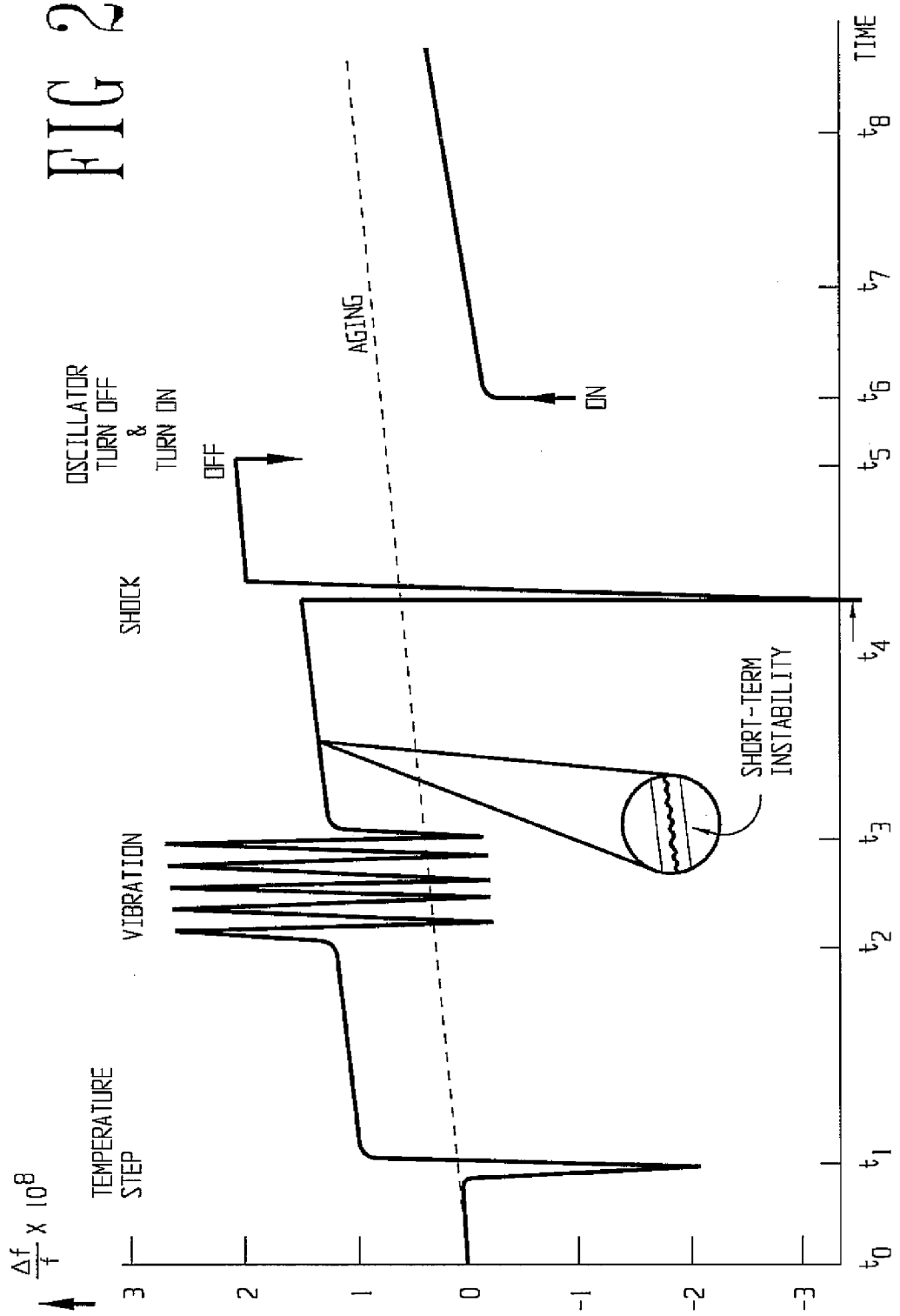
FIG. 2 illustrates various factors that may influence a crystal's oscillation frequency.

FIG. 2 illustrates some, but not all, of the factors that may influence changes in a crystal's frequency behavior over time, and is adapted from "Quartz Crystal Resonators and Oscillators," by John R. Vig, January 2001, which is hereby incorporated by reference as if reproduced in full below. At time t0 the crystal may be coupled to accompanying oscillation circuitry and oscillations may begin. The crystal's oscillation frequency may have a long term aging effect as illustrated by the dashed line in FIG. 2, which is sometimes referred to as the "aging curve." Note that although the aging curve in FIG. 2 shows the frequency increasing over time, other scenarios are possible (depending on the crystal) and may include periods of increasing frequency followed by periods of decreasing frequency, and vice versa. Time $t_1$ may represent a change in frequency as a result of a change in temperature of the crystal. Note that the crystal may assume a different aging curve that may or may not correlate to a previous aging curve as a result of the temperature step. Time periods between $t_2$ and $t_3$ may indicate change in frequency due to physical vibration of the crystal. Also, short term instability may be shown as a minor contribution to the overall frequency variation. Time period $t_4$ may represent a change in frequency as a result of physical shock to the crystal, which usually is measured in multiples of the force of gravity. A shock to the crystal that may produce noticeable variations in crystal frequency may be on the order of several thousand times the force of gravity. Time period $t_5$ may represent powering-off the oscillator, and time period $t_6$ may represent powering-on of the oscillator. Note that as the oscillator is powered-on, the crystal may assume a different aging curve that may or may not correlate to a previous aging curve. Downhole clock 30 of the preferred embodiments may compensate for, and/or may be implemented to nullify, the various physical difficulties that cause frequency deviations, and therefore derived time inaccuracies.

Figure 3:
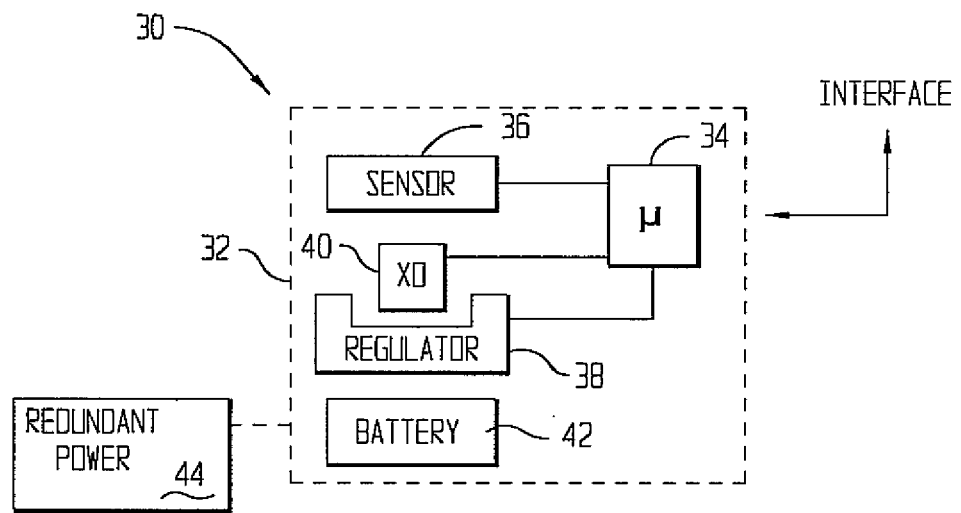
FIG. 3 illustrates a downhole clock according to embodiments of the present invention.

FIG. 3 illustrates embodiments of downhole clock 30. Clock 30 may be contained in a flask 32 and integrated into drillstring 8. Flask 32 may be a metal housing within which various components of clock 30 may be housed. Flask 32 may thus contain a microprocessor 34 coupled to a temperature sensor 36, a temperature regulator 38, and a crystal-based oscillator 40. A battery 42 may be coupled to various components within the flask 32. The sensor 36 may be a resistive temperature device (RTD), where the temperature of the crystal-based oscillator 40 may be determined by the measuring its resistance. However, the temperature sensor 36 may be any suitable temperature sensing device such as a thermocouple or a diode with known temperature coefficient across which a voltage may be indicative of temperature.

The regulator 38 may be of any suitable type for maintaining the crystal-based oscillator 40 at a predetermined temperature, such as, but without limitation, a Peltier-type solid state cooler. The microprocessor 34 may control application of voltage to the regulator 38, and in response, the regulator 38 may either cool or heat the oscillator to the predetermined temperature. The control temperature is preferably above the expected downhole temperature (discussed more fully below). Alternatively, a stand-alone temperature controller (not shown) or individual electrical components may couple to the sensor 36 and regulator 38 to control the crystal-based oscillator's 40 temperature. Battery 42 may be used to power the clock 30, and a redundant power source 44 may also be used to power the clock 30 in the event that battery 42 fails. Redundant power source 44 may represent batteries in the drill string 8, electrical power generated downhole (such as by a downhole generator powered by mud flow), or alternatively if the flask 32 is removed from the drill string 8, then the redundant power source 44 may be derived from external batteries or alternating current (AC) systems commonly available. In this manner, clock 30 may be capable of being powered for extended periods of time, and preferably indefinitely. Clock 30 may also interface to other elements of the drill string 8. For example, circuitry that controls downhole sensors may utilize a time value derived by clock 30 to time-stamp downhole measurements.

Figure 4:
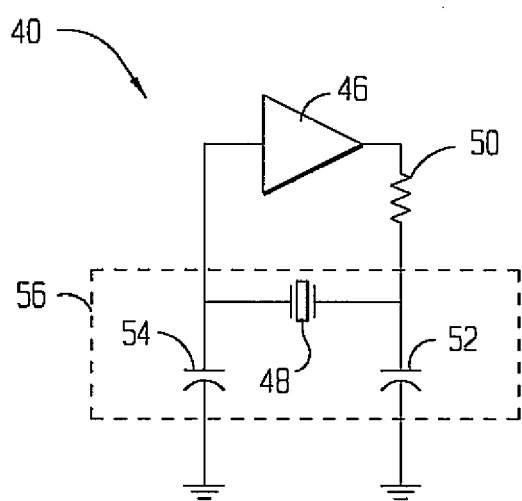
FIG. 4 illustrates an exemplary oscillator structure according to embodiments of the present invention.

FIG. 4 depicts one possible implementation of the crystal-based oscillator 40. This particular configuration may be known as a Pierce-type oscillator. A gain stage 46 may have its output coupled to one terminal of a crystal 48 through resistor 50, while the other terminal of the crystal 48 may be coupled to the input of gain stage 46. The crystal 48 may also have both terminals coupled to ground through capacitors 52 and 54.

Operation of oscillators may be predicted by the Barkhausen criteria, which generally states that oscillation will occur when the magnitude of the loop gain is greater than or equal to unity, while the total phase shift around the loop is a multiple of 360°. The gain stage 46 may be an inverter so that as a signal travels from input to output of gain stage 46, gain may be provided with 180° phase shift. A resonator 56 may be formed by capacitors 52 and 54, along with crystal 48, and may provide the additional phase shift required to establish oscillation. Resistor 50 may be provided to establish a minor amount of start-up current for resonator 56.

Because gain stage 46 may provide 180° of phase shift, the resonator 56 may provide an additional 180° to establish oscillation. The frequency at which the resonator 56 provides the added phase shift determines the oscillation frequency of oscillator 40 and may be controlled by the frequency characteristics of crystal 48. In general, the frequency characteristics of crystal 48 may be determined by the crystal's physical parameters.

Crystals used for crystal-based oscillators may be pieces of quartz that have been separated from a larger quartz bar. Generally a quartz bar has three axes—i.e., x, y, and z—where each axis corresponds to the atomic lattice structure of the quartz bar rather than the physical dimensions of the quartz bar. Additionally, the term "cut" refers to the manner in which the piece of quartz was cut from a quartz bar. By separating or "cutting" the quartz bar at various angles with respect to each of the axes, individual crystals may be made with varying characteristics. Certain crystal cuts may have superior behavior with respect to certain operating conditions. For example, an SC-cut type crystal may have superior thermal characteristics compared to other crystal cuts. Accordingly, crystal 48 is preferably a SC-cut crystal.

Figure 5:
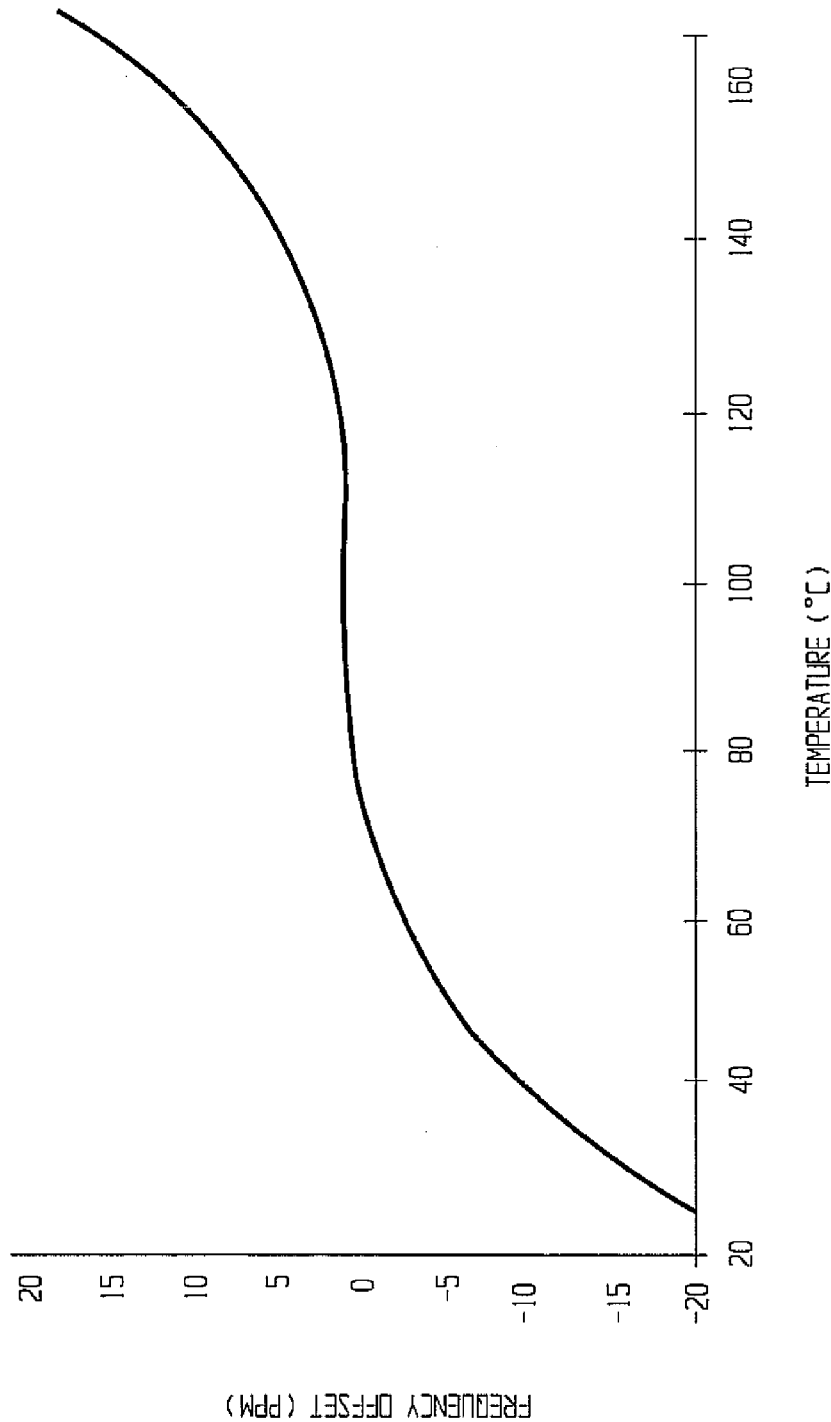
FIG. 5 illustrates the frequency deviations resulting from temperature changes for an SC-cut crystal.

FIG. 5 illustrates the frequency variation (y-axis) versus temperature (x-axis) of an exemplary SC-cut crystal. That the exact numerical values associated with the graph shown in FIG. 5 may vary among SC-cut crystals, yet the overall behavior demonstrated by FIG. 5 may be similar among various SC-cut crystals. As indicated in FIG. 5, SC-cut crystals may operate over a range of temperatures where the frequency variation due to temperature may be negligible. For example, FIG. 5 illustrates that from about 80° to about 110° C. there is a minimal amount of frequency variation. Accordingly, crystal-based oscillator 40 of embodiments of the invention may utilize a SC-cut crystal operated in the temperature range where frequency deviations are small.

Referring again to FIGS. 2–4, clock 30 is discussed in the context of implementing a SC-cut crystal for crystal 48 in crystal-based oscillator 40. Temperature sensor 36 may monitor the temperature of at least the SC-cut crystal 48. Microprocessor 34, or other device or devices, may periodically read sensor 36 and maintain the SC-cut crystal 48 within a predetermined temperature range using regulator 38. The predetermined range may correspond to the range of temperatures where the SC-cut crystal 48 has small (if any) frequency variation with respect to temperature. Also, the crystal 48 is preferably chosen such that the temperature range over which it has small frequency variation is above the expected downhole temperature. In this manner, the oscillation frequency provided by the oscillator 40 may be substantially free from possible temperature variations, e.g., the temperature step at $t_1$ in FIG. 2.

The oscillation frequency of crystal-based oscillator 40 may be used to create a downhole time value for time-stamping data measurements. A counter (not specifically shown) may count oscillations of crystal-based oscillator 40 and provide periodic pulses to the microprocessor 34, from which a time value may be derived. The counter may be an independent circuit, or alternatively may be implemented within microprocessor 34. As the downhole sensors make data measurements, the time value derived from the frequency of oscillation may be used to create a time-stamp to indicate the time at which the data measurements are taken.

As discussed above, the physical environment to which the crystal 40 (FIG. 3) is exposed may affect its frequency of oscillation, and therefore may affect the time value derived based on the frequency of oscillation. In the preferred embodiments, however, these frequency deviations may be neglected because their overall effect is minimal or zero, or their effects may be compensated. Referring again to FIG. 2, for the time periods between $t_2$ and $t_3$, there is illustrated changes in the frequency of oscillation of an exemplary crystal based on vibration experienced by the crystal. While vibration may cause short-term frequency instability, it is noted that the frequency instability may be oscillatory around the particular aging curve for the crystal. Thus, over long periods of time, any frequency deviation, and therefore time value errors, average out. For a downhole clock used in a seismic-while-drilling operation with a seismic source at the surface (or a second borehole) imparting energy to the earth that is received at a later time by sensors in a drillstring, the effects of vibration may be ignored inasmuch as the time periods between successive shots (imparting of interrogation energy) may be significantly longer than the period (and therefore the frequency) of the vibration-induced frequency deviations. Stated otherwise, if the amount of time between successive data measurements, and therefore successive time-stamps, is longer than the physical vibration time—i.e., $t_3$ minus $t_2$—then the time deviations caused by short-term frequency deviations average out. Therefore, the accuracy of the downhole clock 30 may be unaffected by physical vibrations.

With regard to physical shock that produces a frequency deviation, these physical shocks may be on the order of several thousand times the force of gravity in order to cause significant frequency deviation. Since the downhole clock 30 may not experience such a drastic amount of physical shock, frequency deviations due to physical shock may be neglected. With regard to changes in oscillation frequency and aging characteristics changes caused by power cycling of the oscillator (periods $t_5$ and $t_6$ of FIG. 2), battery 42, along with redundant power source 44, may prevent the oscillator 30 from being powered-off intermittently, and preferably keep oscillator 30 powered-on indefinitely so that oscillator 30 may maintain a constant aging curve.

Despite implementing the various techniques mentioned above to overcome the frequency deviations caused by shock, vibration and power-cycling, the frequency of crystal-based oscillator 40 still may be affected by crystal aging. Accordingly, microprocessor 34 may contain an algorithm that when executed compensates for long-term crystal aging affects. In particular, prior to deploying the clock 30 downhole, a highly accurate clock source (e.g., an atomic clock) may be used to characterize the long-term aging characteristics of crystal 48. Characterization data representing the long-term aging of crystal 48 may be used to create the algorithm that models the crystal's frequency change over time. In particular, using characterization data and error estimation techniques, an algorithm may be developed that correlates the frequency of oscillation to the age of the crystal. Using the algorithm, the time value produced by clock 30 derived from the frequency of operation of the crystal may advantageously be compensated for crystal aging. Based on the aging compensation, and other factors discussed above, clock 30 may be substantially free from the factors that cause frequency variations and therefore time deviation. It is preferred that the crystal remain not only powered up indefinitely, but also that the crystal be maintained at high temperature, even when not in use.

In the event that power to clock 30 is lost, temperature control of the crystal is lost and/or the crystal assumes a different aging curve, the flask 32 may be removed from the downhole equipment, and a new algorithm may be developed by re-characterizing crystal 48. Microprocessor 34 may contain circuitry to monitor power and indicate when the clock 30 needs to be re-characterized due to a power outage.

Prior to deploying the clock 30 at the drill site, it may be checked against an accurate time standard. For example, a precise frequency measuring system, preferably an atomic clock disciplined by a a global positioning system (GPS) receiver, which typically receives a broadcast atomic clock signal, may be used to check the accuracy of the clock 30 prior to deployment. In the event that there is too much skew between the atomic-based reference and the downhole clock, the clock may be sent back for re-calibration and a new downhole clock may be substituted in its place. With the downhole clock tracking a highly accurate clock source (i.e., atomic-based source) measurements made downhole may be time-stamped with the time value of the downhole clock. Accordingly, an accuracy of better than a few parts-per-billion over the time to complete a bit run (which bit run may be in excess of 200 hours) may be obtained by utilizing some of the preferred embodiments.

Numerous other variations and modifications will become apparent to those skilled in the art once the above disclosure is fully appreciated. For example, some embodiments may not require a microprocessor and the compensation algorithm may be implemented using less complex methods. In addition, although the embodiments are discussed with respect to land-based seismic measurement systems, other seismic measurement systems, such as marine-based systems, are possible as well. It is intended that the following claims be interpreted to embrace all such variations and modifications.

What is claimed is:

1. A method, comprising:
   maintaining a crystal-based oscillator at a predetermined temperature range, wherein the crystal-based oscillator is a single-mode oscillator;
   compensating for the crystal-based oscillator's long-term aging characteristics; and
   providing time information for downhole measurements based on the crystal-based oscillator's frequency of oscillation.

2. The method of claim 1, further comprising powering the crystal-based oscillator when the crystal-based oscillator is not in use.

3. The method of claim 1, further comprising maintaining the crystal-based oscillator at the predetermined temperature above expected downhole temperatures.

4. A method, comprising:
   maintaining a crystal-based oscillator at a predetermined temperature range;
   compensating for the crystal-based oscillator's long-term aging characteristics;
   providing time information for downhole measurements based on the crystal-based oscillator's frequency of oscillation;
   maintaining the crystal-based oscillator at the predetermined temperature above expected downhole temperatures;
   maintaining the crystal-based oscillator at the predetermined temperature when not in user; and
   wherein the crystal-based oscillator is a single-mode oscillator.

5. The method of claim 1, further comprising maintaining the crystal-based oscillator at a temperature such that the crystal-based oscillator's frequency deviations as a result of temperature are small.

6. A method, comprising:
   maintaining a crystal-based oscillator at a predetermined temperature range;
   compensating for the crystal-based oscillator's long-term aging characteristics according to an algortihm;
   providing time information for downhole measurements based on the crystal-based oscillator's frequency of oscillation;
   determining the algorithm prior to deploying the crystal downhole by comparing the crystal's long-term aging characteristics to a more accurate clock source; and
   wherein the crystal-based oscillator is a single-mode oscillator.

7. A downhole tool, comprising:
   a tool body having a receiver, the tool body adapted to be coupled within a drill string;
   a microprocessor coupled to the receiver;
   a single-mode oscillator coupled to the microprocessor;
   a temperature sensor coupled to the oscillator; and
   a temperature regulator coupled to the oscillator and the temperature sensor;
   wherein the oscillator is maintained within a predetermined temperature range by the temperature regulator, and wherein the microprocessor executes an algorithm that compensates for the oscillator's long-term frequency deviation.

8. The downhole tool of claim 7, further comprising a plurality of power sources such that the oscillator may be powered for an extended period of time.

9. The downhole tool of claim 7, wherein the oscillator is a crystal-based oscillator.

10. The downhole tool of claim 9, wherein the temperature range relates to a range of temperatures over which the oscillator's frequency deviations due to changes in temperature are small.

11. The downhole tool of claim 9, wherein the oscillator includes an SC-cut crystal and the oscillator is maintained at a temperature such that the crystal's frequency deviations as a result of temperature are small.

12. The downhole tool of claim 7, further comprising a flask that is integrated into the tool body, and wherein at least the oscillator is housed within the flask.

13. The downhole tool of claim 7, wherein the algorithm is determined prior to deploying the oscillator downhole by comparing the oscillator's long-term aging characteristics to a more accurate clock source.

14. The downhole tool of claim 13, wherein the more accurate clock source is an atomic clock.

15. A downhole clock source, comprising:
means for providing a single-mode oscillating signal having a frequency, wherein the signal is used to create a downhole time source;
means for regulating said means for providing a single-mode oscillating signal within a predetermined temperature range; and
means for compensating the downhole time source according to a frequency aging characteristics of the means for providing a single-mode oscillating signal.

16. The downhole clock source of claim 15, wherein said means for compensating further comprises an algorithm that corresponds to how the frequency of signal of the means for providing changes over time.

17. A method, comprising:
maintaining a crystal-based oscillator at a predetermined temperature range;
compensating for the crystal-based oscillator's long-term aging characteristics;
providing time information for measurements based on the crystal-based oscillator's frequency of oscillation;
maintaining the crystal-based oscillator at the predetermined temperature above expected temperatures;
maintaining the crystal-based oscillator at the predetermined temperature when not in use; and
wherein the crystal-based oscillator is a single-mode oscillator.

18. A method, comprising:
maintaining a crystal-based oscillator at a predetermined temperature range;
compensating for the crystal-based oscillator's long-term aging characteristics according to an algorithm;
providing time information for measurements based on the crystal-based oscillator's frequency of oscillation;
determining the algorithm prior to utilizing the crystal-based oscillator by comparing the crystal's long-term aging characteristics to a more accurate clock source; and
wherein the crystal-based oscillator is a single-mode oscillator.

19. A downhole clock source, comprising:
a single-mode oscillator including a crystal, wherein the oscillator provides a frequency for deriving a downhole time value;
a temperature regulator, wherein the regulator maintains the oscillator at a predetermined temperature range; and
wherein the time value is compensated to account for the crystal's long-term aging characteristics.

20. The downhole clock of claim 19, wherein the predetermined temperature range is above the expected downhole temperatures.

21. The downhole clock of claim 19, wherein the predetermined temperature is below the expected downhole temperature.

22. The downhole clock of claim 19, further comprising a plurality of power sources such that the oscillator may be powered for an extended period of time.

23. The downhole clock of claim 19, wherein the predetermined temperature range relates to a range of temperatures over which the oscillator's frequency deviations due to changes in temperature are small.

24. The downhole clock of claim 19, wherein the crystal is an SC-cut crystal and is maintained at a temperature such that the crystal's frequency deviations as a result of temperature are small.

25. The downhole clock of claim 19, wherein the crystal's long-term aging properties are compensated according to an algorithm that is determined prior to deploying the crystal downhole.

26. The downhole clock of claim 19, wherein the algorithm is determined by comparing the crystal's frequency aging characteristics to a more accurate clock source.

27. The downhole clock of claim 19, wherein the more accurate clock source is an atomic clock.

* * * * *